(12) United States Patent
Nandakumar et al.

(10) Patent No.: US 12,500,117 B2
(45) Date of Patent: Dec. 16, 2025

(54) SHALLOW TRENCH ISOLATION STRUCTURE WITH NITRIDE PULLBACK BY IMPLANTATION TREATMENT

(71) Applicant: TEXAS INSTRUMENTS INCORPORATED, Dallas, TX (US)

(72) Inventors: Mahalingam Nandakumar, Richardson, TX (US); Douglas Harvey Newman, Crowley, TX (US); Byron Joseph Palla, Murphy, TX (US); Haowen Bu, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 639 days.

(21) Appl. No.: 17/854,852

(22) Filed: Jun. 30, 2022

(65) Prior Publication Data
US 2024/0006230 A1 Jan. 4, 2024

(51) Int. Cl.
*H01L 21/762* (2006.01)
*H01L 21/311* (2006.01)
*H10D 84/80* (2025.01)

(52) U.S. Cl.
CPC .. *H01L 21/76224* (2013.01); *H01L 21/31111* (2013.01); *H10D 84/811* (2025.01); *H01L 21/31144* (2013.01)

(58) Field of Classification Search
CPC ......... H01L 21/76224; H01L 21/31111; H01L 27/0629; H01L 21/31144
See application file for complete search history.

(56) References Cited

U.S. PATENT DOCUMENTS

| | | | |
|---|---|---|---|
| 6,818,526 B2 | 11/2004 | Mehrad et al. | |
| 6,930,018 B2 | 8/2005 | Mehrad et al. | |
| 7,045,410 B2 | 5/2006 | Mehrad et al. | |
| 9,559,017 B2* | 1/2017 | Xu | H01L 21/02323 |
| 2020/0119036 A1* | 4/2020 | King | H10B 43/35 |
| 2023/0345690 A1* | 10/2023 | Xie | H10B 10/12 |
| 2023/0411290 A1* | 12/2023 | Xie | H10D 30/6757 |

FOREIGN PATENT DOCUMENTS

KR 1020060076088 A 7/2006

OTHER PUBLICATIONS ip.com search history (Year: 2025).*
Espacenet English translation of KR20060076088A.

* cited by examiner

Primary Examiner — Zandra V Smith
Assistant Examiner — Andre C Stevenson
(74) Attorney, Agent, or Firm — Andrew R. Ralston; Frank D. Cimino

(57) ABSTRACT

A semiconductor device includes a trench extending into a semiconductor layer. A liner layer is on a sidewall of the semiconductor layer within the trench. The liner layer extends from the sidewall to a top surface of the semiconductor layer. An isolation structure is within the trench. The isolation structure is between a first region of the semiconductor layer and a second region of the semiconductor layer. The semiconductor layer includes a third region that couples the first region to the second region of the semiconductor layer. The third region of the semiconductor layer is substantially free of phosphorus contamination.

15 Claims, 16 Drawing Sheets

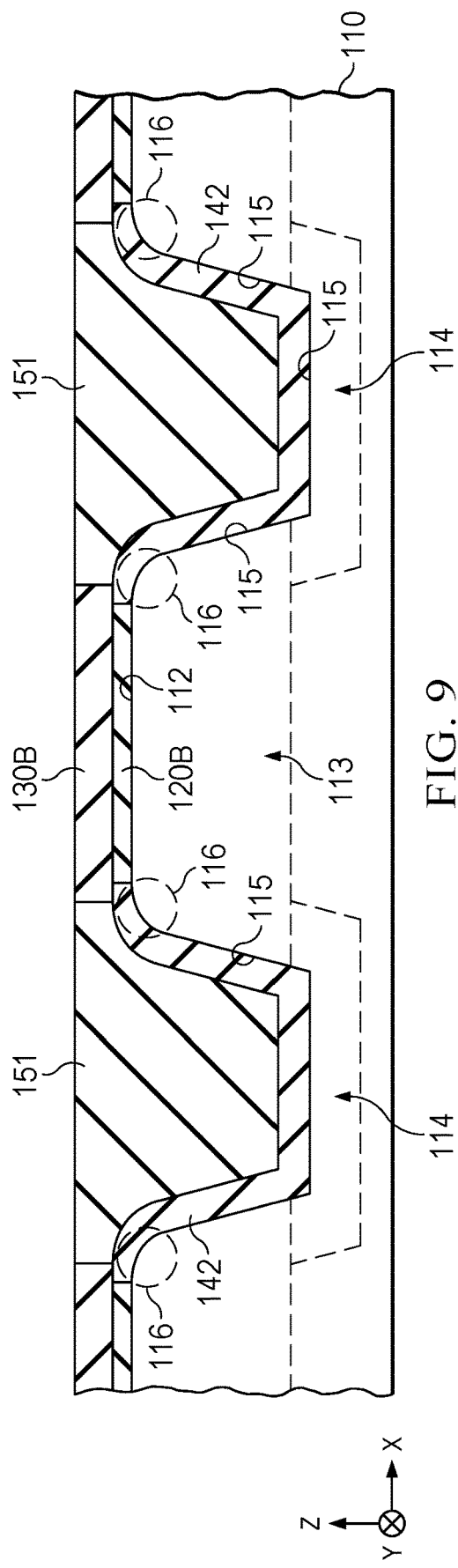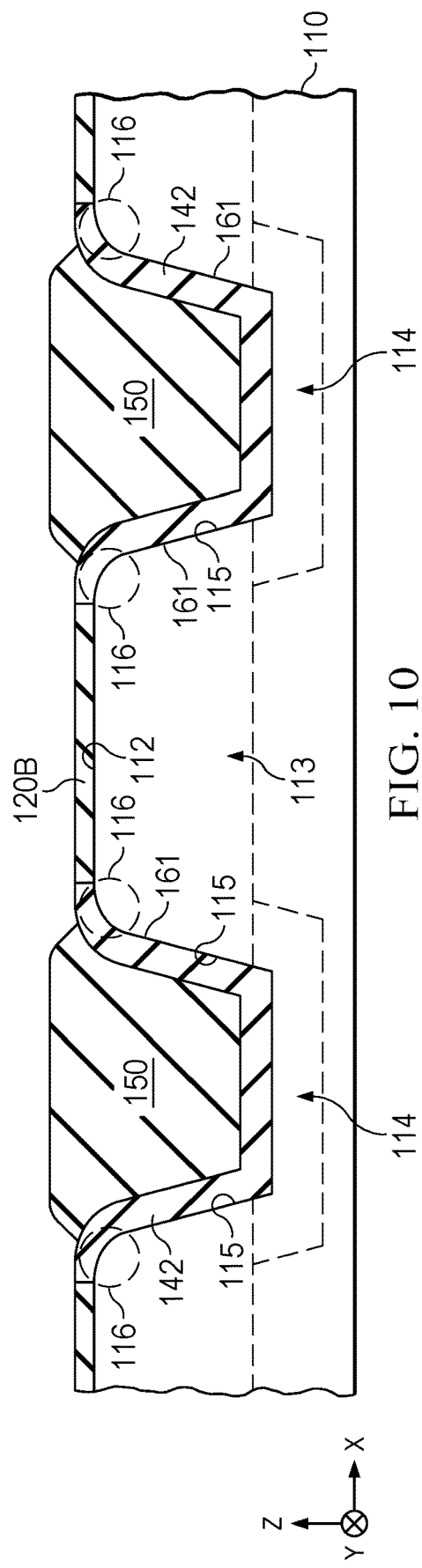

SHALLOW TRENCH ISOLATION STRUCTURE WITH NITRIDE PULLBACK BY IMPLANTATION TREATMENT

TECHNICAL FIELD

This disclosure is directed generally to semiconductor devices, and more specifically but not exclusively to forming shallow trench isolation structures.

BACKGROUND

Shallow trench isolation (STI) structures are often used in semiconductor devices for isolating one active region from another active region on a semiconductor substrate. However, multiple oxide deglaze steps or other steps after an STI trench is filled with dielectric material can create or expand a "divot" at the edge of the STI trench. This divot can adversely affect performance of a transistor formed adjacent the trench.

SUMMARY

Various disclosed methods and devices that may be beneficially applied to transistor devices, methods of making transistor devices, or other applications where high voltages may be applied in the devices. While such examples may be expected to provide improvements in performance relative to baseline devices and methods, such as improved drain current ($I_D$)-gate voltage ($V_G$) characteristics, no particular result is a requirement of the present invention unless explicitly recited in a particular claim.

In one aspect of the present disclosure, a method of forming a semiconductor device includes exposing a top surface of a semiconductor layer through an opening in a dielectric layer. A trench is formed in the semiconductor layer below the opening. A first liner layer is formed on a trench surface of the semiconductor layer within the trench. An element species is implanted into the dielectric layer. The first liner layer and a portion of the dielectric layer are removed, thereby forming a recess between the dielectric layer and the top surface. A second liner layer is formed on the trench surface, the second liner layer extending into the recess. An isolation structure is formed within the trench.

In another aspect of the present disclosure, a method of forming a semiconductor device includes forming an opening in an oxide layer and a nitride layer over a semiconductor layer. At least one element species is implanted into the nitride layer. A trench in the semiconductor layer is formed under the opening. By a wet acidic etch a portion of the nitride layer is removed, thereby exposing a corner of the semiconductor layer, and a recess is formed between the nitride layer and the semiconductor layer. A liner layer on the semiconductor layer is formed within the trench, and the liner layer extends from a sidewall of the trench into the recess. An isolation structure is formed within the trench.

In another aspect of the present disclosure, a semiconductor device includes a trench extending into a semiconductor layer. A liner layer is on a sidewall of the semiconductor layer within the trench. The liner layer extends from the sidewall to a top surface of the semiconductor layer. An isolation structure is within the trench. The isolation structure is between a first region of the semiconductor layer and a second region of the semiconductor layer. The semiconductor layer includes a third region that couples the first region to the second region of the semiconductor layer. The third region of the semiconductor layer is substantially free of phosphorus contamination.

BRIEF DESCRIPTION OF THE DRAWINGS

For a detailed description of various examples, reference will now be made to the accompanying drawings in which:

FIGS. 1 to 11C illustrate cross-sectional views of example structures at various stages of the formation of an example semiconductor device using an example method;

DETAILED DESCRIPTION

Figure 1:
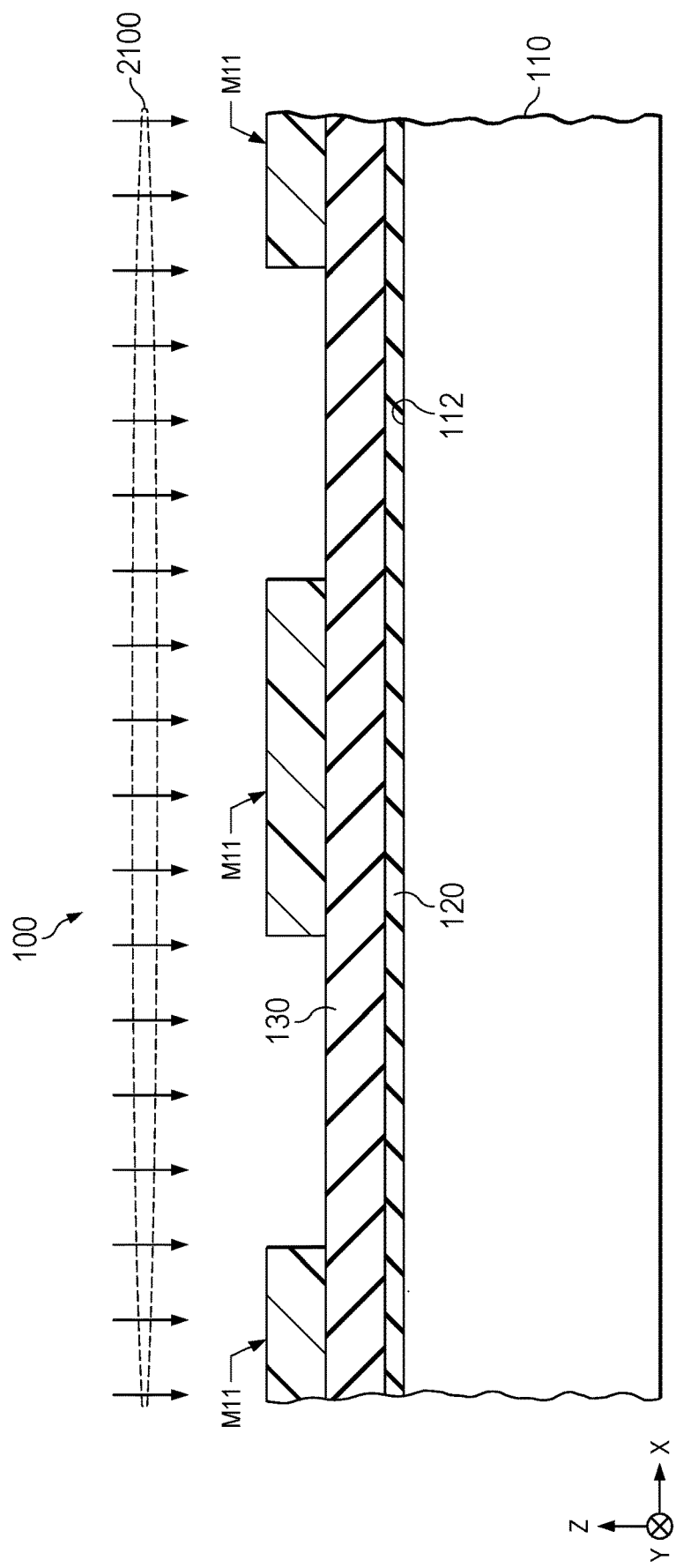

Shallow trench isolation (STI) structures are often used in semiconductor devices to electrically isolate electrical devices in neighboring active portions of a semiconductor substrate. Some STI structures are formed by etching a trench in a semiconductor substrate using a silicon nitride hardmask over a silicon oxide "pad oxide" layer. The trench is then filled with a dielectric material such as a plasma oxide, and the oxide fill is polished back to the silicon nitride layer by a chemical mechanical polishing (CMP) process. Some process flows include multiple oxide dealaze steps after the STI trench is filled. The deglaze steps can cause loss of the dielectric material at trench corners where the dielectric material meets a sidewall of the trench, resulting in a "divot" at such locations. This divot sometimes results in a location at which a later-formed polysilicon gate is separated from underlying semiconductor substrate by an oxide layer that is thinner than a gate oxide layer. The polysilicon is sometimes referred to as "wrapping around" the trench corner. This thin oxide region can result in a corner parasitic transistor that has a lower threshold voltage than the transistor being formed, resulting in undesirable performance in the semiconductor device, such as an undesirable hump in the drain current ($I_D$) versus gate voltage ($V_G$) characteristics.

In some process technologies, hot phosphoric acid used to pull back the nitride hardmask layer away from the STI trench to expose the STI corner to a subsequent thermal oxidation step. The greater exposure results in greater conversion of the silicon at the corner to thermal oxide, thus rounding the corner and increasing the thickness of the thermal oxide, thus avoiding the parasitic transistor. Such a strategy may be suitable in some applications, such as switching transistors for which specific 1-V characteristics of the transistor may not be a primary focus of the transistor electrical characteristics. But in analog applications the use of hot phosphoric acid to pull back the nitride layer can lead to phosphorus contamination in the semiconductor region adjacent to STI structure. The phosphorous contamination can lead to leakage between neighboring devices and I-V characteristics that are undesirable for analog applications.

Some examples of the present disclosure provide semiconductor devices and methods of manufacturing such devices that reduce or eliminate the effect of the corner parasitic transistor without the aforementioned phosphorus contamination. Some example methods implant an atomic species into the silicon nitride hardmask to weaken the silicon nitride, thereby rendering the weakened silicon nitride soluble in aqueous hydrofluoric acid (HF), thus pulling back the nitride hardmask without the use of phosphoric acid. Such methods and semiconductor devices may be beneficially employed, for example and without implied limitation, in integrated circuits employing analog transistors or high-voltage transistors.

FIGS. 1 to 11C illustrate cross-sectional views of example structures at various stages of the formation of an example semiconductor device, e.g., an integrated circuit (IC) 100, containing an STI isolation structure, and accordingly illustrate an example method of forming the IC 100. FIG. 11D illustrates a plan view of example structures at a same stage of the formation as FIGS. 11B and 11C. Some of the FIGS. 1 through 11 include a cartesian coordinate reference for ease of visualization and reference.

Turning initially to FIG. 1, the IC 100 is shown at an early stage of manufacturing. A semiconductor layer 110 may be a semiconductor substrate, such as a handle wafer, or may be a layer formed over a substrate, such as an epitaxial layer. In the following description the semiconductor layer is referred to as silicon, but other examples may include semiconductor materials such as GaAs, SiGe and the like. In various examples the semiconductor layer is a lightly-doped p-type layer, but is not limited to any particular conductivity type or doping level. A silicon oxide layer 120 has been formed over a top surface 112 of the semiconductor layer 110, and a silicon nitride layer 130 has been formed over silicon oxide layer 120. (Hereinafter, a silicon oxide layer may be referred to as an "oxide layer" and a silicon nitride layer may be referred to as a "nitride layer".) The oxide layer 120 may sometimes be referred to as a pad oxide layer 120.

Referring to the coordinate reference in FIG. 1, the X-axis and the Y-axis are orthogonal to each other and are parallel to the top surface 112 and are thus each referred to as an "in-plane direction." The Z-axis is perpendicular to the X and Y-axes and is thus referred to as an "out-of-plane direction."

A patterned photoresist layer M11 has been formed over the nitride layer 130 and includes openings at locations that trenches are to be formed for isolation structures, e.g., STI isolation structures using an etch process 2100. The etch process 2100 may include any suitable process, such as an RIE plasma etch. The etch process 2100 may include multiple process recipes to remove the nitride layer 130, then the pad oxide layer 120, and then the semiconductor layer 110.

Figure 2:
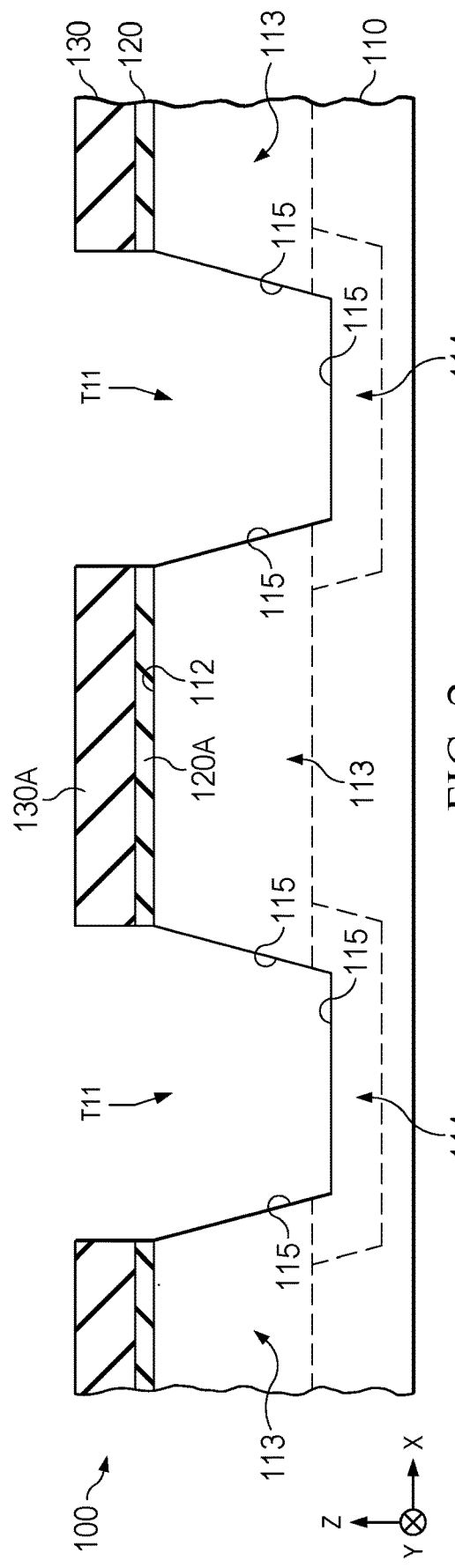

FIG. 2 illustrates the IC 100 after forming trenches T11 by the etch process 2100. The trenches T11 may have a depth of less than 1 μm and are therefore sometimes referred to as "shallow" trenches, as compared to deeper trenches with a greater depth. In some examples, the trenches T11 have a depth of 0.1 μm to 0.7 μm. Semiconductor regions 113 are located between the trenches T11, and are sometimes referred to as mesas 113. Thus, nearest-neighboring regions or mesas 113 of the semiconductor layer 110 are spaced apart by the trenches T11, and are connected by regions 114. The trenches T11 each have a trench surface 115 that includes a bottom surface and side surfaces. Over each mesa 113 a remaining portion 120A of the pad oxide layer 120 is located between the mesa 113 and a remaining portion of the nitride layer 130 which is referred to hereinafter as a hardmask 130A. The following discussion is directed to a single hardmask 130A over a single one of the mesas 113 without implied limitation to any particular number of remaining portions of the nitride layer 130 that are formed.

Figure 3:
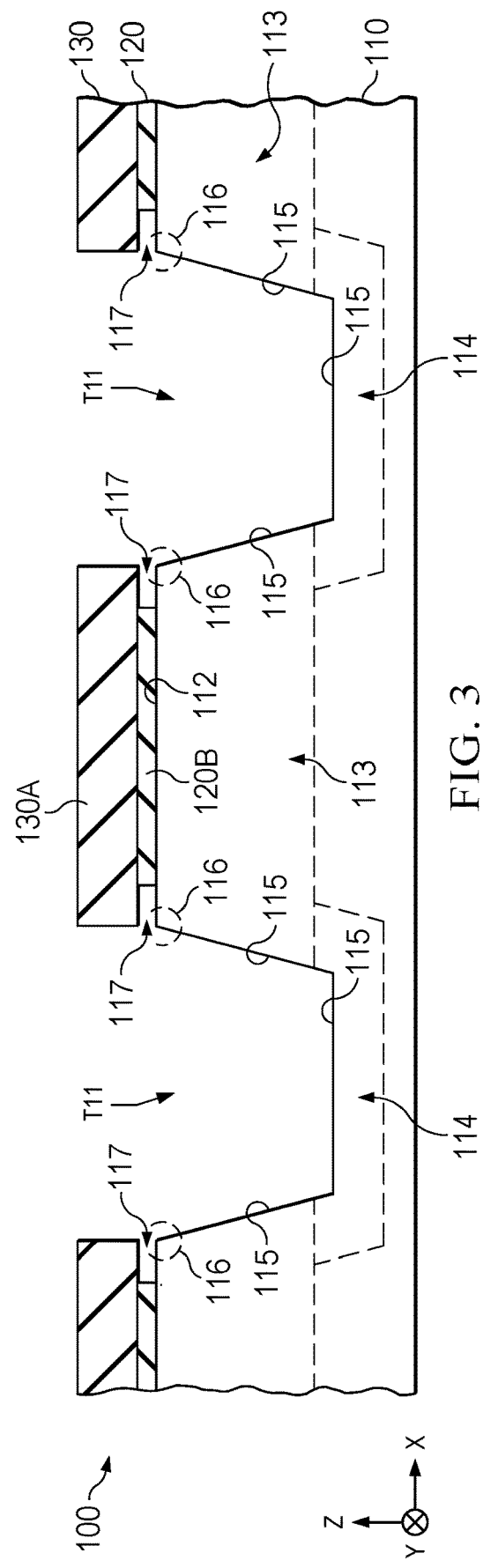

FIG. 3 illustrates the IC 100 after forming a recess 117 (e.g., undercut) between the mesa 113 and the corresponding hardmask 195130A by, for example, etching the remaining portion 120A of the pad oxide layer 120 with dilute aqueous hydrogen fluoride or other suitable etchant, thereby forming a remining portion 120B of the pad oxide layer 120. The recesses 117 expose corners of the trenches T11 at the top of the trench sidewalls to a subsequent oxidation step and allow later-formed liner layers (see, e.g., liner layers 141 in FIG. 4) to extend into the recesses 117.

Figure 4:
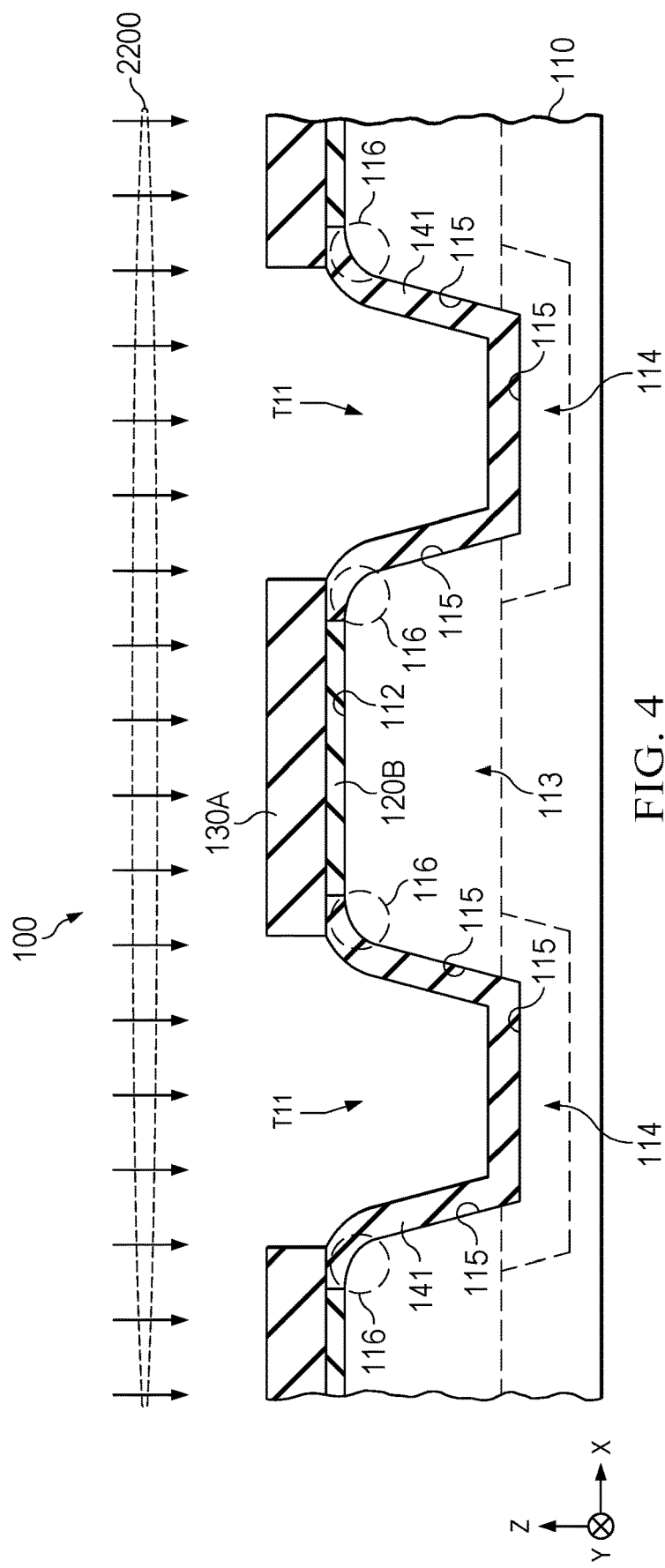

FIG. 4 illustrates the IC 100 after formation of liner layers 141 on or over the trench surfaces 115 of the semiconductor layer 110 and extending into the recesses 117. The liner layers 141 may be formed by, for example, thermal oxidation process 2200 or other suitable oxidation process. The exposed trench corners are partially consumed by the oxidation, resulting in rounded corners 116 between the trenches T11 and the top surface 112 of the semiconductor layer 110. In examples in which the semiconductor layer 110 material is silicon, the liner layer 141 includes silicon oxide. Rounding the corners 116 has the effect of increasing the radius of curvature of the rounded corners 116, which may increase the thickness of the liner layer 141 over the rounded corners 116, and may reduce electric fields at the rounded corners 116 during operation of the IC 100.

Figure 5:
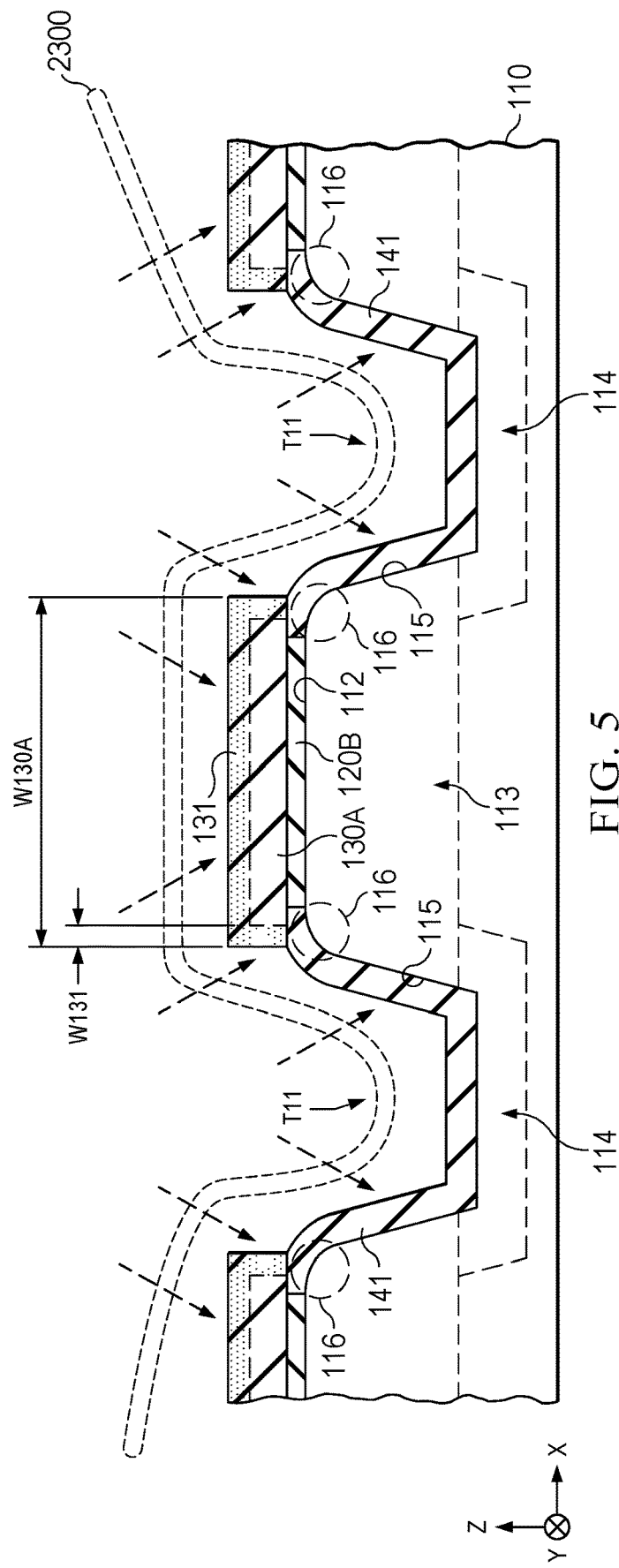

FIG. 5 illustrates the IC 100 during implantation of at least one element species into the liner layers 141 and peripheries 131 of the hardmask 130A by ion implantation 2300. The element species generally includes a non-doping element such as a group IV element (e.g. Si or Ge) or a noble element (e.g. Ne, Ar or Kr). Implanting the element species can weaken the silicon nitride in the peripheries 131 rendering the peripheries more soluble in an etchant in which silicon nitride would normally be generally poorly soluble. In one example, the ion implantation 2300 includes implanting the element species with an energy in range of 3 keV to 10 keV. In some examples, the semiconductor layer 110 may be tilted with respect to the direction of the implantation beam direction by an angle in a range of +5 degrees to +45 degrees and −5 degrees to −45 degrees, for example +/−15 degrees. The tilt angle defined as the angle between a direction orthogonal to the top surface 112 (surface normal, or Z-axis) and the implantation beam direction. In certain examples, the dose of the implanted element specie is in a range of $2\times10^{14}$ cm$^{-2}$ to $7\times10^{15}$ cm$^{-2}$. In some examples, the implantation can be performed multiple times (or can include multiple implantations or implantation processes) to improve implantation uniformity. In certain examples, the implantation (such as implantation 2300) is performed four times, and the handle wafer is rotated by 90 degrees after each implantation. In the example of FIG. 5, the hardmask 130A has a width W130A, and the implantation-treated periphery 131 has a width W131 at each end (or each side) of the hardmask 130A.

Figure 6:
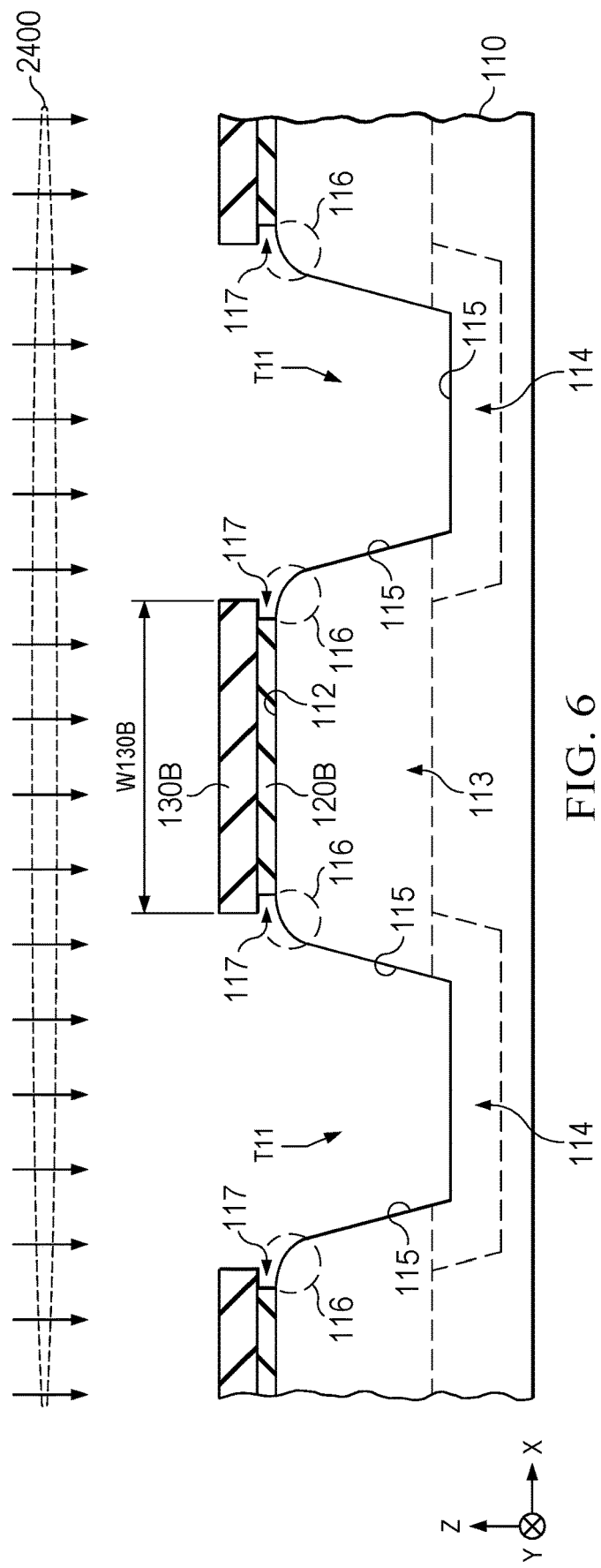

FIG. 6 illustrates the IC 100 after removing the liner layer 141 and the peripheries 131 with an isotropic etch process 2400. The etch process 2400 may be any process that removes the liner layer 141 at a faster rate than the etch process 2400 removes silicon nitride and is substantially free of phosphorous. In some examples, the etch process 2400 uses a wet chemical etchant that includes hydrogen fluoride (HF). For example, the etch process 2400 may use an aqueous solution of hydrogen fluoride that includes one unit volume of ~50% aqueous HF (as-received) diluted with 100 unit volumes of DI water (v/v) to make a 1:100 HF:H$_2$O v/v solution. Such a solution may have an HF molarity of 0.02-0.03 M, and may be referred to generally as a dilute HF solution. In some examples, the wet chemical etchant includes a buffer agent such as ammonium fluoride (NH$_4$F). The semiconductor layer 110 may be immersed in the wet chemical etchant at about 22° C. for approximately 5 minutes during the etching process 2400. In some examples, a 1:100 HF:H$_2$O solution removes the implantation-treated periphery 131 approximately four times faster than the untreated hardmask 130A. "Substantially free of phosphorous" in the context of a wet chemical etchant means the etchant includes no more than 1 ppm of phosphorous.

The removal of the periphery 131 pulls back the hardmask 130A along the X-axis and the Y-axis (not shown), resulting in a shortened hardmask 130B over the mesa 113. The pullback of the hardmask 130B results in a reduced width W130B of the hardmask 130B. In some examples, a pullback distance (equal to width W131 of the removed periphery 131, FIG. 5) of each end (or each side) of the hardmask 130B is in a range of 10 nm to 15 nm, and the width W130B is reduced by 20 nm to 30 nm with respect to the width W130A. Further, the etch process 2400 removes the liner layer 141, exposing the rounded corners 116 and forming a recess 117 between the hardmask 130B and the mesa 113. By using the dilute aqueous hydrogen fluoride instead of hot phosphoric acid to remove the implanted periphery 131 of the hardmask 130A, and to remove the liner layer 141, phosphorus contamination in the semiconductor layer 110 (such as the mesa 113 and the region 114, and the silicon nitride layer may sometimes be referred to as a hardmask 130) that could otherwise result from the use of hot phosphoric acid can be prevented. Accordingly, the semiconductor layer 110 may be substantially free of phosphorus contamination (or phosphorus). With respect to the semiconductor layer 110, the term "substantially free of phosphorous contamination" or similar means that the concentration of phosphorous in the semiconductor layer 110 is no greater than about 1E12 cm$^{-3}$.

In contrast, if hot phosphoric acid were to be used to pull back the hardmask 130A, some phosphorus could diffuse into the semiconductor layer 110, resulting in phosphorus contamination in the semiconductor layer 110. Subsequent formation of liner layers (such as the liner layers 142 described with respect to FIG. 7) may involve annealing at a temperature such as 1050° C., which can cause phosphorus contamination to diffuse deeper into the semiconductor layer 110. Such phosphorus contamination can result in undesirable leakage current between electronic components in adjacent mesas 113 intended to be electrically isolated by an interposed STI structure, possibly degrading performance of the IC 100, e.g. by increasing standby leakage and/or battery power dissipation, or possibly causing failure of the IC 100.

Figure 7:
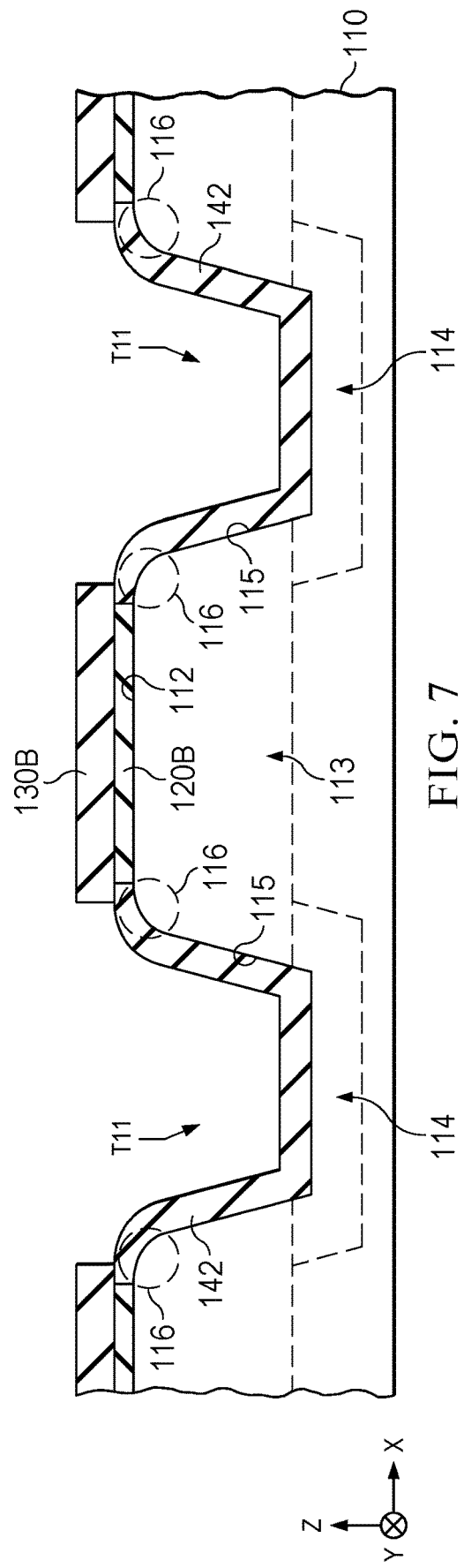

FIG. 7 illustrates the IC 100 after formation of liner layers 142 on or over the trench surfaces 115 and extending into the recesses 117, e.g. between the mesa 113 and the hardmask 130B. The liner layers 142 may be formed by thermal oxidation process or other suitable oxidation process, which may round or further round the rounded corners 116 by consuming additional semiconductor material at the corners of the trenches T11. This rounding may further increase the radius of curvature of the rounded corners 116 and provide for a thicker oxide layer at the corner than would be the case for a smaller radius of curvature. The liner layer 142 is wrapped around and covers the respective rounded corner 116 of the semiconductor layer 110, wherein "wrapped around" means the liner layer 142 forms a continuous layer extending from the trench surface 115 over the rounded corner 116 and to the top surface 112. The thicker oxide at the rounded corner 116 can prevent or mitigate local thinning of gate oxide in a subsequent gate oxidation step, which may otherwise result in gate oxide failure in the presences of a high electric field at the corner.

Figure 8:
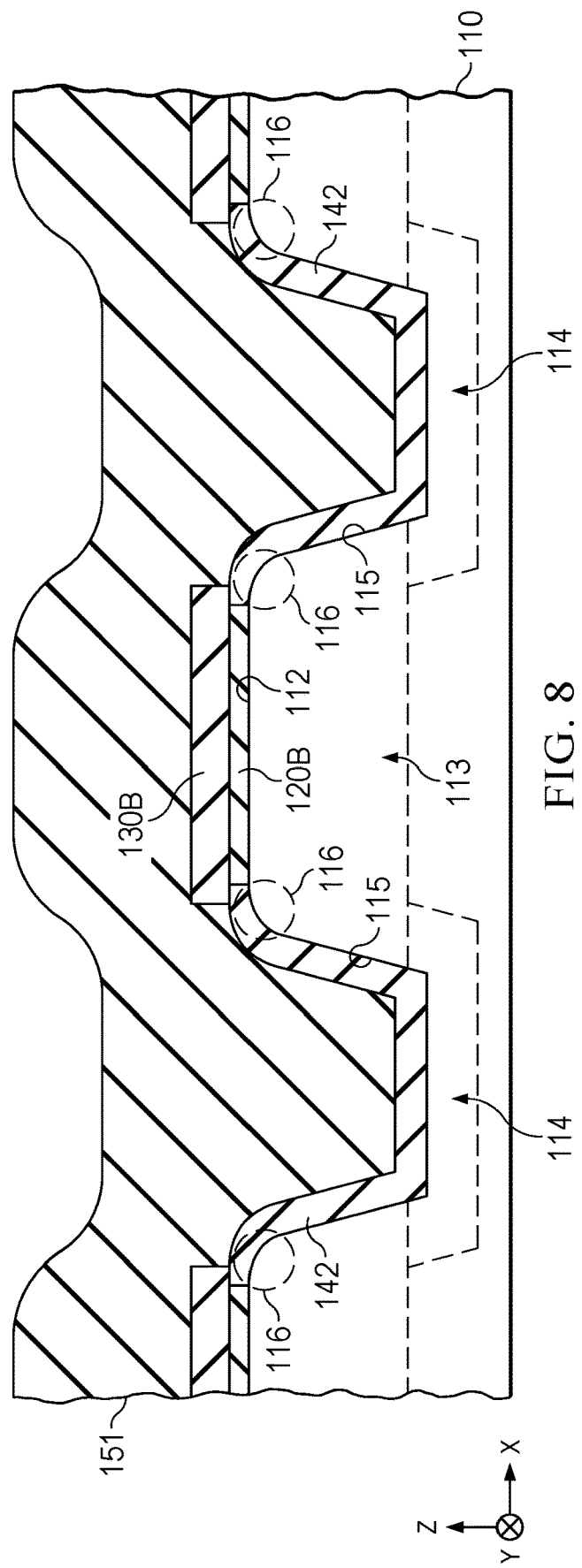

FIG. 8 illustrates the IC 100 after deposition of an isolation material 151 into the trenches T11 and over the hardmask 130B. The isolation material 151 may in general have topography that results in a non-planar top surface. In some examples, the isolation material 151 includes an oxide such as plasma-deposited silicon oxide. In certain examples, the isolation material 151 is deposited by a high density plasma (HDP) process, and may be an HDP-deposited silicon oxide.

FIG. 9 illustrates the IC 100 after planarization of the isolation material 151 by chemical mechanical polishing (CMP) or other suitable planarizing technique. In the described example, the hardmask 130B may serve as a CMP stop layer as well as a hard mask for the trench etch process 2100 (FIG. 1). The planarization removes the isolation material 151 from over the hardmask 130B, separating portions of the isolation material 151 located in the trenches T11 to produce isolation structures 150. The planarization may result in surfaces of the isolation structures 150 that are about coplanar with the top surface of the hardmask 1308 as shown, or the surfaces may be slightly recessed below the top surface of the hardmask 130B.

FIG. 10 illustrates the IC 100 after removal of the hardmask 130B by, for example, etching with hot phosphoric acid or a dry etch that is selective to oxide. The underlying remaining portion 120B of the pad oxide layer 120, liner layer 142 (e.g., sidewall oxide) and the isolation material 151 may protect the mesa 113 and trench surface 115 (such as trench sidewalls) from phosphorus contamination. The silicon nitride removal process may also remove a portion of the isolation structures 150 due to non-zero etch rate of the isolation material (oxide), thus recusing the height of the isolation structures 150 above the top surface 112, and rounding corners of the isolation structures 150.

FIGS. 11A-11D illustrate aspects of the formation of one or more passive or active electronic components of the IC 100. Such components may include, for example, a metal-oxide-semiconductor field effect transistor (MOSFET), a bipolar transistor, a diode, a drain-extended MOS (DEMOS) transistor or other suitable electronic component. In the following discussion a MOSFET 128 is shown as one example.

Figure 11A:
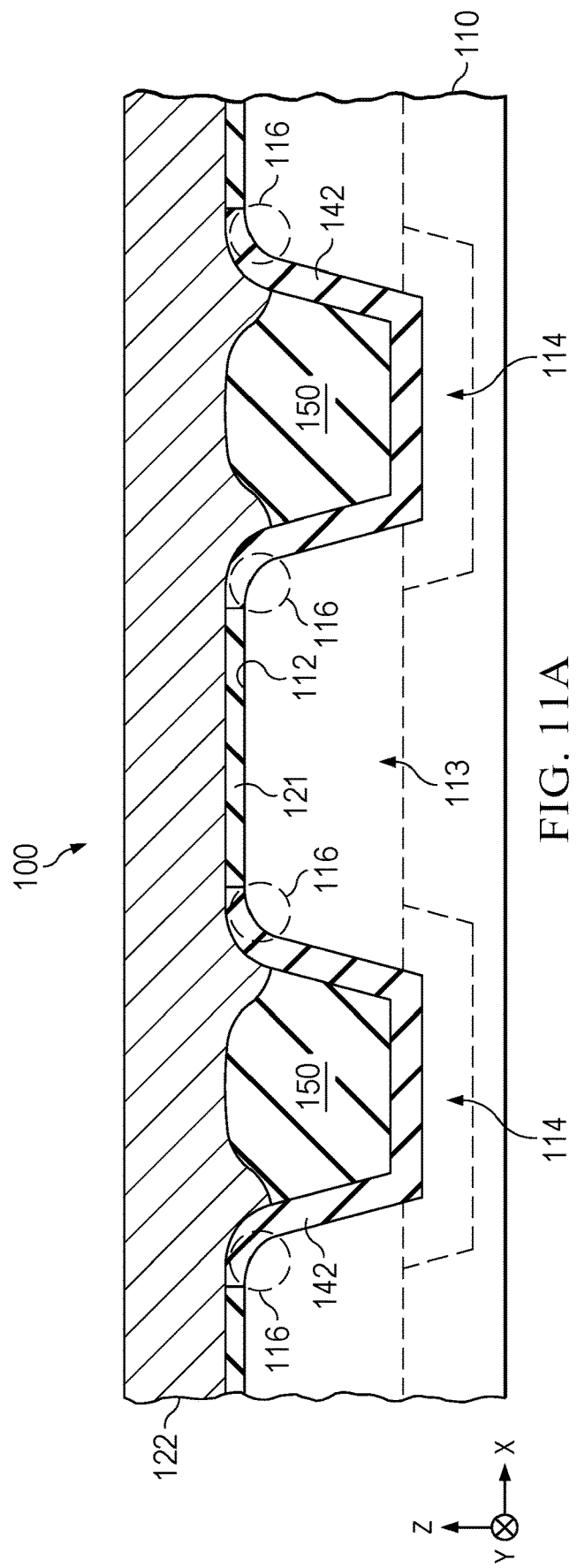

In FIG. 11A, a deglaze (oxide removal) process has been performed, thereby stripping the remaining portion 120B of the pad oxide layer 120 and producing divots at the corners of the isolation structures 150. The divots may result in thinning of the oxide remaining over the rounded corners 116, but in accordance with the described examples the remaining oxide is thicker than might otherwise be the case in a baseline process flow. A gate dielectric layer 121 has been formed over the mesa 113, e.g. by thermal oxidation, and a gate electrode layer 122, e.g. polysilicon, has been formed over the gate dielectric layer 121.

Figure 11B:
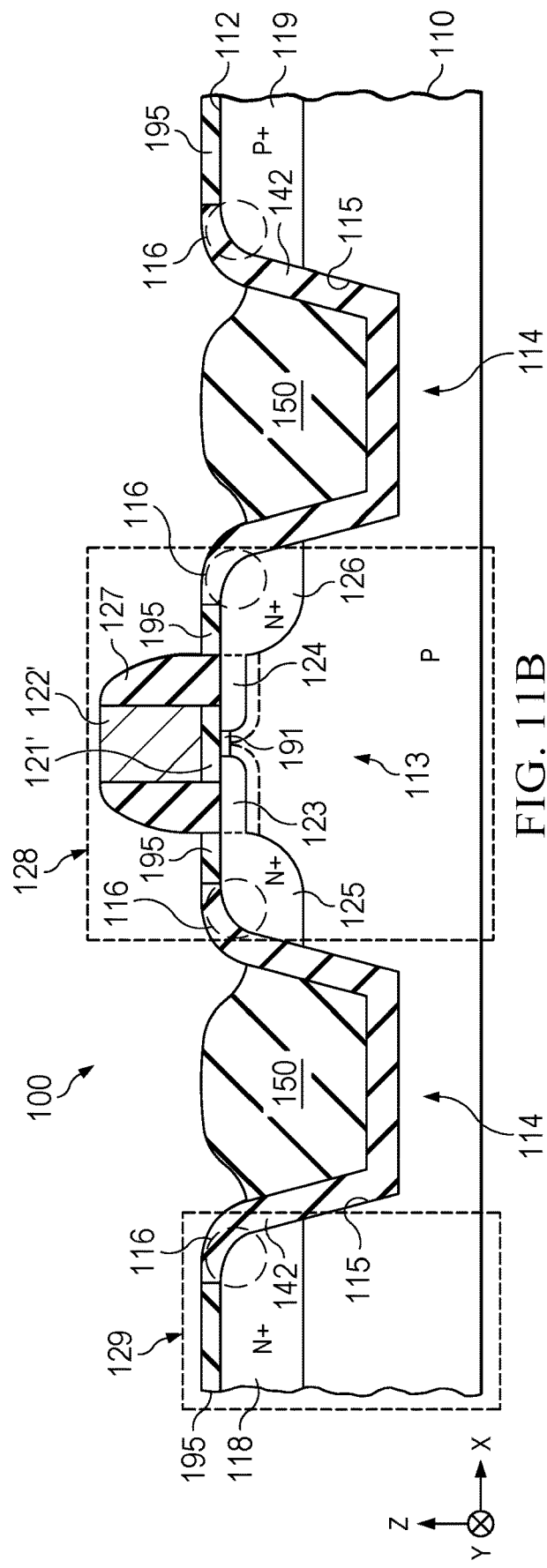
Figure 11C:
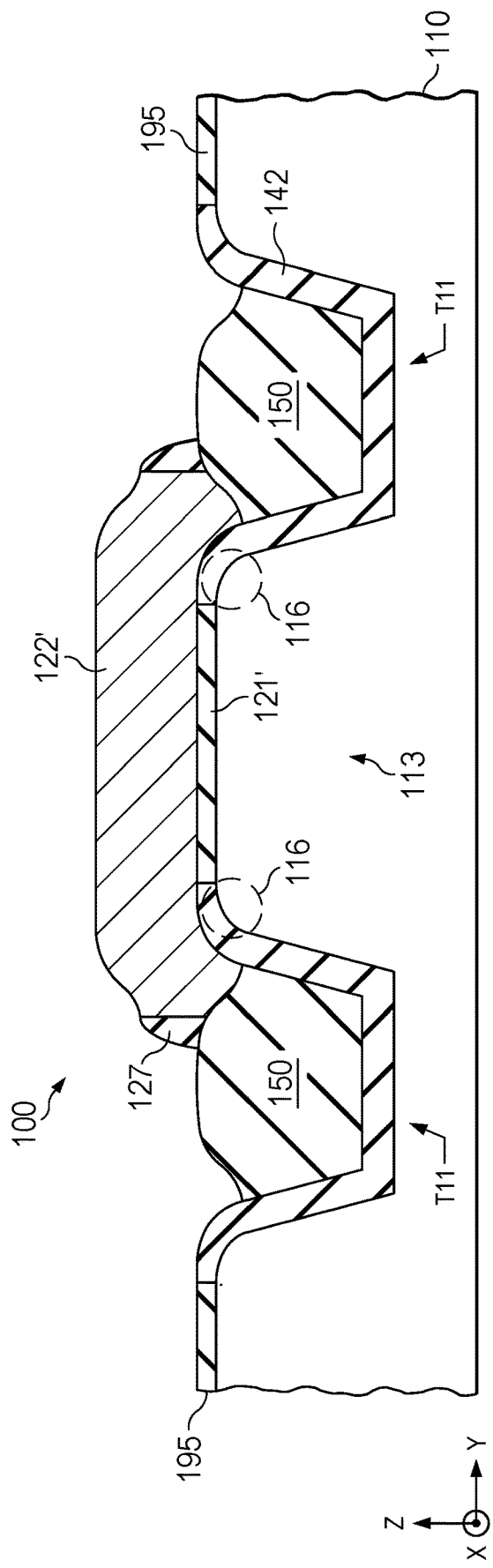
Figure 11D:
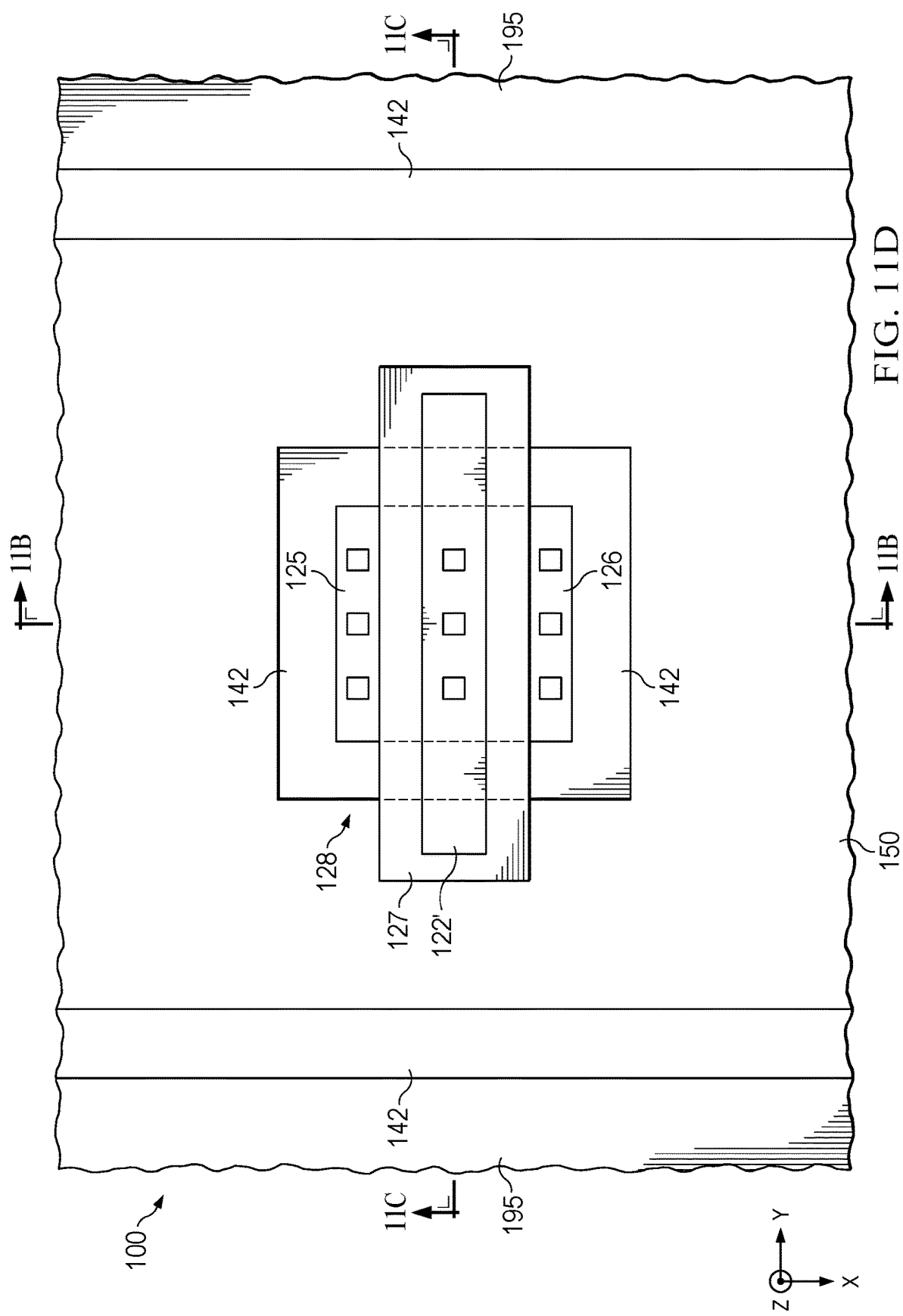
FIG. 11D illustrates a plan view of example structures at a same stage of the formation as FIGS. 11B and 11C.

FIG. 11B illustrates the MOSFET 128 in a section through the X-Z plane, FIG. 11C shows the MOSFET 128 in a section through the Y-Z plane, and FIG. 11D illustrates the MOSFET 128 in plan view in the X-Y plane. FIGS. 11B-11D are referred to concurrently in the following discussion. In a nonlimiting example the semiconductor layer 110 is p-type.

The gate electrode layer 122 and gate dielectric layer 121 have been patterned to form a gate electrode 122' and a gate dielectric 121'. Various dopant implants have been performed to produce source/drain extension regions 123, 124, source region 125, and drain region 126. Sidewall spacers 127 have been formed on sidewalls of the gate electrode 122'. Silicide layers 195 provide ohmic contact to source region 125 and drain region 126. A channel region 191 is located below gate dielectric 121' and can conduct current between the source region 125 and the drain region 126 when an appropriate voltage is applied to the gate electrode 122'. FIG. 11D includes unreferenced vertical interconnects to the source region 125, the drain region 126, and the gate electrode 122'.

As an example, an n-type region 118 (FIG. 11B) with an N+ dopant concentration can be formed by implanting n-type dopants into a portion of semiconductor layer 110. The n-type region 118 and the semiconductor layer 110 form a diode 129 with a p-n junction between the n-type region 118 and the semiconductor layer 110. In another example, a substrate contact 119 with P+ dopant concentration can be formed by implanting p-type dopants into a portion of semiconductor layer 110 to increase the dopant concentration. Other devices may be formed in or over the semiconductor layer 110 in other examples.

FIG. 11C illustrates the MOSFET 128 in a section taken along the long axis of the gate electrode 122', e.g. the Y-axis. The gate electrode 122' extends over two adjacent STI structures 150, including over and filling the divots at the rounded corners 116 of the trenches T11. Each liner layer 142 is wrapped around and covers the rounded corners 116 of the respective trench T11. Because the thickness of the liner layers 142 over the rounded corners 116 is thicker than the gate dielectric 121', the MOSFET 128 is expected to have an $I_D$-Vg characteristic that substantially independent of the thickness of the liner layers 142 at the rounded corners 116, e.g. does not display the aforementioned hump in the $I_D$-Vg characteristic.

Further, the semiconductor layer 110 (including the mesa 113 and regions 114) is expected to be substantially free of phosphorus contamination due to the use of aqueous HF to remove weakened portions of the hardmask 130A, which can be achieved by using implantation to treat the periphery 131 of the hardmask 130A (see, e.g., FIG. 5) and further pulling back the hardmask 130A using the aqueous HF. For example, the mesa 113 and the regions 114 are expected to be free of phosphorus contamination (or phosphorus), and accordingly leakage current between the diode 129 and the MOSFET 128 is expected to be prevented or reduced in the IC 100 relative to alternatives that include the use of hot phosphoric acid to pull back a nitride layer over the mesa 113.

In some examples, the semiconductor layer 110 includes silicon, the pad oxide layer 120 includes silicon oxide (such as $SiO_2$), the gate dielectric layer 121 includes silicon oxide, the liner layer 142 includes silicon oxide, the hardmask 130A include silicon nitride, and the STI structure 150 includes silicon oxide. The STI material (such as STI fill oxide) of the STI structure 150 may be deposited by various means, e.g., high density plasma (HDP) or high aspect ratio non-plasma chemical-vapor-deposition oxide process (HARP), and may be subjected to different post deposition thermal treatments.

FIGS. 12 to 15 illustrate cross-sectional views of example structures at various stages of the formation of another example integrated circuit (IC) 1200 containing an STI structure, and accordingly illustrate an alternate example method of forming a semiconductor device containing an STI structure. In this method, implantation is used to treat a periphery of the hardmask before forming the STI trench in the semiconductor layer 210. Accordingly, a liner layer such as the liner layer 141 (FIG. 4) is not needed to protect the semiconductor layer 210, because the portions of the semiconductor layer 210 that are implanted with the element species are removed when the STI trench is formed in the semiconductor layer 210. Accordingly, fabrication costs can be reduced.

Figure 12:
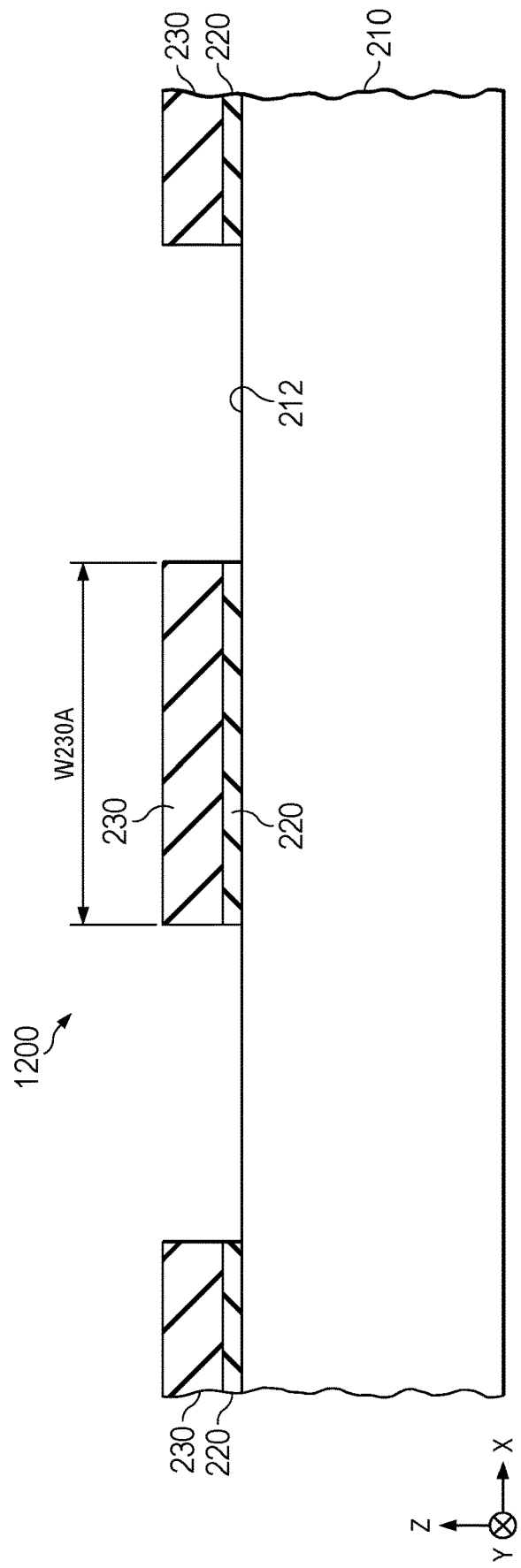
FIGS. 12 to 15 illustrate cross-sectional views of example structures at various stages of the formation of another example semiconductor device using another example method.

FIG. 12 illustrates the IC 1200 after formation of an oxide layer (e.g., a pad oxide layer) 220 on or over a semiconductor layer 210 (such as a silicon layer), and a nitride layer 230 on or over the oxide layer 220. The nitride layer 230 has a width W230A. The semiconductor layer 210 has a top surface 212. Openings in the oxide layer 220 and nitride layer 230 expose portions of the top surface 212 of the semiconductor layer 210.

Figure 13:
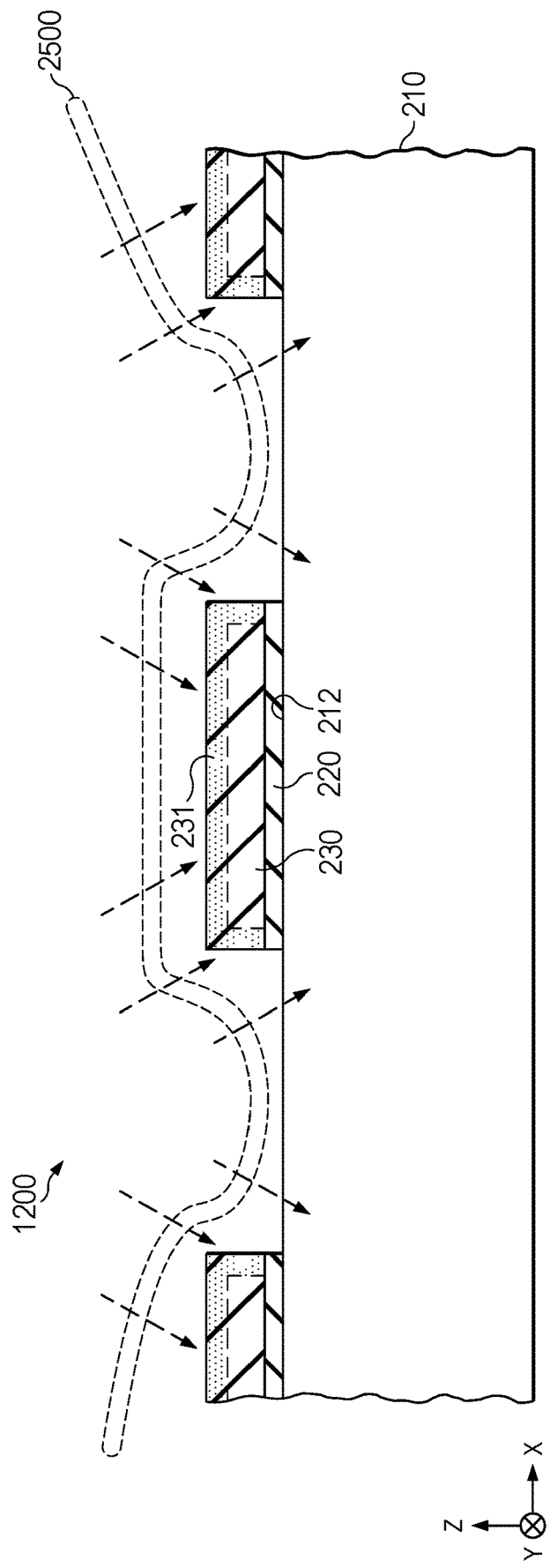

FIG. 13 illustrates the IC 1200 during implantation of at least one element species into peripheries 231 of the nitride layer 230 by ion implantation 2500. In some examples, the element species includes a non-doping element such as a group IV element (e.g. Si or Ge) or a noble element (e.g. Ne, Ar or Kr). The element specie is implanted into the peripheries 231, such that the peripheries 231 can be etched with dilute aqueous hydrogen fluoride. The at least one element species is also implanted in portions of the semiconductor layer 210 adjacent to exposed portions of the top surface 212. Various parameters or configurations of ion implantation 2500, such as a tilted angle between the top surface 212 and the implantation beam direction, the implantation energy, and the implantation dose, may be the same as or similar to the implantation 2300 described previously.

Figure 14:
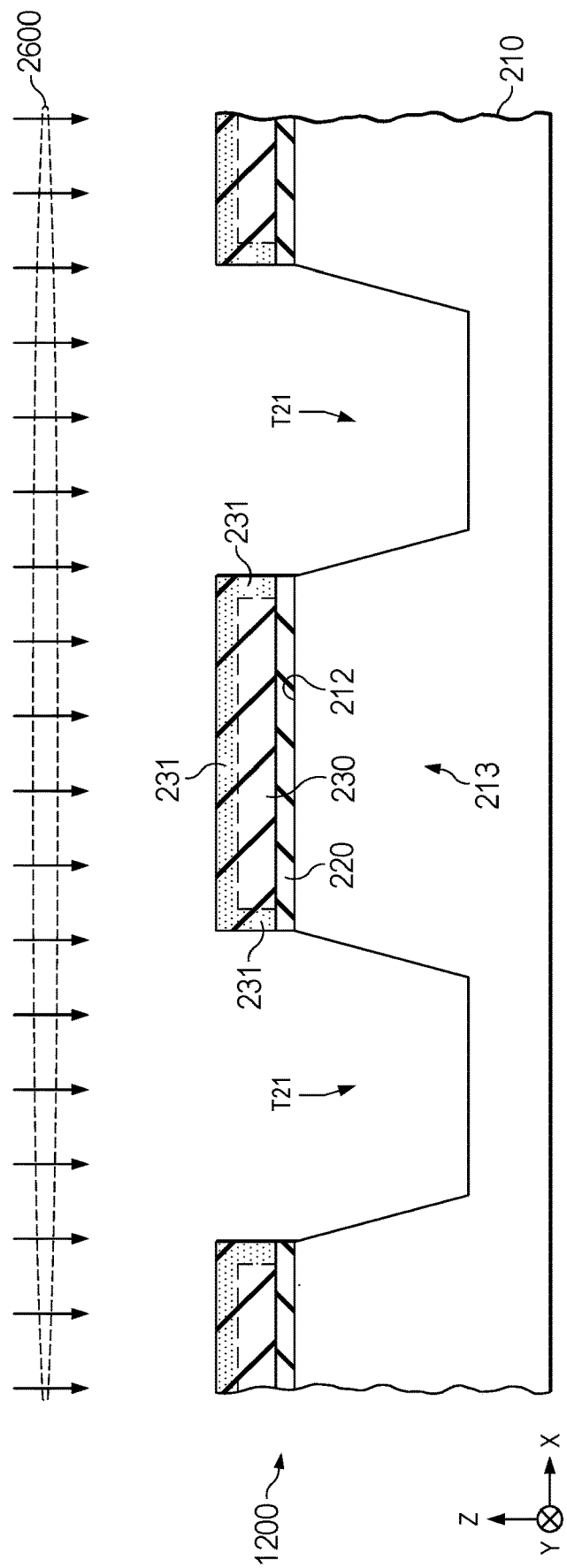

FIG. 14 shows a cross-section of the IC 1200 after formation of trenches T21 in the semiconductor layer by an etching process 2600. In some examples (not shown), a patterned photoresist layer is present during the etching process 2600. The etching process 2600 produces trenches T21 in the semiconductor layer 210.

Figure 15:
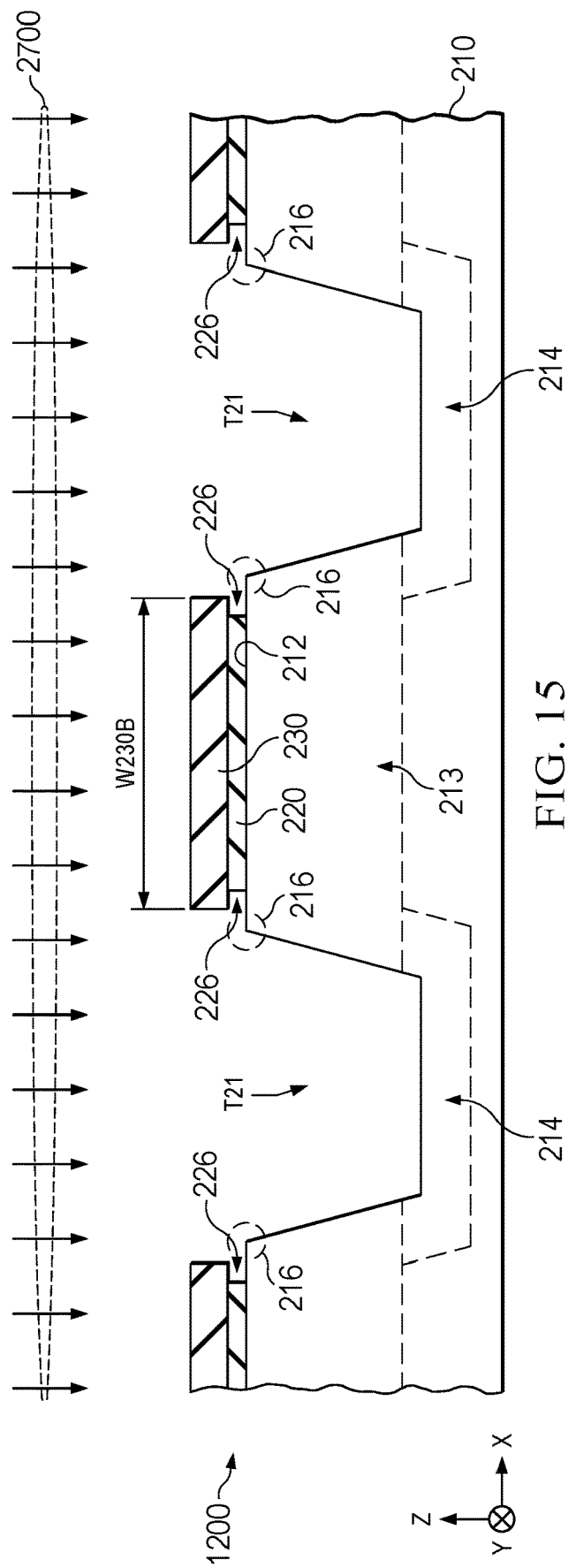

FIG. 15 illustrates the IC 1200 after etching by an etching process 2700. At least a portion of the peripheries 231 have been removed by the etching process 2700, and a portion of the oxide layer 220 has similarly been removed to form a recess 226 between the nitride layer 230 and the top surface 212. The etching process 2700 may use a dilute aqueous HF solution as previously described. The removal of the periphery 231 pulls back the nitride layer 230 (reduces the lateral width of the nitride layer 230), such that the width of the nitride layer 230 is reduced from W230A (FIG. 12) to W230B. Accordingly, the corner 216 of the semiconductor layer 210 at the trench T21 is exposed. As described previously, phosphorus contamination from hot phosphoric acid into the semiconductor layer 210 (such as regions 213 and 214) can be prevented. Accordingly, the semiconductor layer 210 (including regions 213 and regions 214) is substantially free of phosphorus.

Further, processes or steps the same as or similar to the above-described processes or steps of FIGS. 7 to 11 can be performed to form a semiconductor device that is same as or similar to the above-described IC 100. References can be made to above descriptions, such as descriptions associated with the IC 100 and the method of forming the IC 100.

Table 1 includes illustrates example pullback etching rates in nitride hardmask layers without and with ion implantation after etching by dilute aqueous HF. In these examples, 1 unit volume of HF is diluted by 100 unit volumes of $H_2O$. In other examples, the dilute aqueous hydrogen fluoride can have another suitable concentration.

TABLE 1

| Implantation | Nitride layer without implantation | Nitride layer with 5 keV Si implantation | Nitride layer with 12 keV Si implantation | Nitride layer with 9 keV Ge implantation |
|---|---|---|---|---|
| Pullback Distance (nm) | 0.0 | 9.9 | 11.6 | 11.9 |

The pullback of the nitride layer indicates that a portion of the nitride layer is etched away along a lateral direction (such as +/−X direction in FIGS. 6, 15), such that lateral width of the nitride layer is reduced (see, e.g., FIGS. 6, 15). In the examples of Table the nitride layers are etched with a 1:100 HF:H$_2$O solution for five minutes. The pullback distance for a nitride layer without Si or Ge implantation is nil, the pullback distance with a 5 keV Si implantation is 9.9 nm, the pullback distance with a 12 keV Si implantation is 11.6 nm, and the pullback distance with a 9 keV Ge implantation is 11.9 nm. These examples demonstrate that treatment of a silicon nitride layer such as the hardmask 130A with ion implantation (e.g., with Si or Ge) results in sufficient pull back with HF etch to provide the described methods without phosphorous contamination of a semiconductor substrate in which STI structures are formed.

Unless otherwise stated, "about," "approximately," or "substantially" preceding a value means+/−10 percent of the stated value. Modifications are possible in the described examples, and other examples are possible, within the scope of the claims.

What is claimed is:

1. A method of forming a semiconductor device, comprising:
    exposing a top surface of a semiconductor layer through an opening in a dielectric layer;
    forming a trench in the semiconductor layer below the opening;
    forming a first liner layer on a trench surface of the semiconductor layer within the trench;
    implanting an element species into the dielectric layer;
    removing the first liner layer and a portion of the dielectric layer, thereby forming a recess between the dielectric layer and the top surface;
    forming a second liner layer on the trench surface, the second liner layer extending into the recess; and
    forming an isolation structure within the trench.

2. The method of claim 1, wherein the dielectric layer comprises silicon nitride and further comprising removing the portion of the dielectric layer with hydrofluoric acid.

3. The method of claim 1, wherein forming the second liner layer includes thermally oxidizing the semiconductor layer thereby rounding an STI corner between the recess and the trench.

4. The method of claim 1, wherein the semiconductor layer comprises silicon, and the first and second liner layers comprise silicon oxide.

5. The method of claim 1, wherein implanting the element species into the first liner layer and the dielectric layer includes implanting at least one of silicon, germanium, or argon.

6. The method of claim 1, wherein implanting the element species into the first liner layer and the dielectric layer includes implanting the element species with a tilt angle in a range of +5 degrees to +45 degrees with respect to a normal to the top surface.

7. The method of claim 1, wherein implanting the element species into the dielectric layer increases a wet etch rate at a surface of the dielectric layer with respect to an interior of the dielectric layer.

8. The method of claim 1, wherein implanting the element species includes implanting at least one of silicon, germanium, or argon with an implantation energy in a range of 3 keV to 10 keV.

9. The method of claim 1, wherein a dose of the element species is in a range of $2\times10^{14}$ cm$^{-2}$ to $7\times10^{15}$ cm$^{-2}$.

10. The method of claim 1, wherein removing the portion of the dielectric layer includes exposing for five minutes the dielectric layer to a hydrogen fluoride solution having an HF molar concentration in a range from about 0.2 mole/liter to about 0.3 mole/liter.

11. The method of claim 10, wherein the hydrogen fluoride solution includes an ammonium fluoride buffer.

12. The method of claim 1, wherein removing the portion of the dielectric layer includes exposing the dielectric layer to a hydrogen fluoride solution that is substantially free of phosphorus.

13. The method of claim 1, further comprising:
    forming a transistor in a first region of the semiconductor layer that forms a first sidewall of the recess; and
    forming a diode in a second region of the semiconductor layer that forms a second sidewall of the recess.

14. The method of claim 1, further comprising forming a gate electrode of a transistor, the gate electrode extending over the isolation structure and into the recess.

15. The method of claim 1, wherein implanting the element species into the first liner layer and the dielectric layer includes implanting neon or krypton.

* * * * *